US012772442B2

(12) United States Patent
Hua et al.

(10) Patent No.: US 12,772,442 B2
(45) Date of Patent: Oct. 20, 2026

(54) DYNAMIC RANDOM ACCESS MEMORY AND FORMING METHOD THEREFOR

(71) Applicant: ICLEAGUE TECHNOLOGY CO., LTD., Jiaxing (CN)

(72) Inventors: Wenyu Hua, Jiaxing (CN); Xing Yu, Jiaxing (CN)

(73) Assignee: ICLEAGUE TECHNOLOGY CO., LTD., Jiaxing (CN)

( * ) Notice: Subject to any disclaimer, the term of this patent is extended or adjusted under 35 U.S.C. 154(b) by 582 days.

(21) Appl. No.: 18/552,837

(22) PCT Filed: Sep. 2, 2021

(86) PCT No.: PCT/CN2021/116127

§ 371 (c)(1),
(2) Date: Apr. 4, 2024

(87) PCT Pub. No.: WO2022/213534

PCT Pub. Date: Oct. 13, 2022

(65) Prior Publication Data

US 2024/0244833 A1 Jul. 18, 2024

(30) Foreign Application Priority Data

Apr. 7, 2021 (CN) ......................... 202110373398.3

(51) Int. Cl.
*H10B 12/00* (2023.01)
*H10D 62/10* (2025.01)
(Continued)

(52) U.S. Cl.
CPC ........... *H10B 12/488* (2023.02); *H10B 12/02* (2023.02); *H10B 12/482* (2023.02);
(Continued)

(58) Field of Classification Search
None
See application file for complete search history.

(56) References Cited

U.S. PATENT DOCUMENTS 5,208,657 A 5/1993 Chatterjee et al.
5,214,603 A 5/1993 Dhong et al.
(Continued)

FOREIGN PATENT DOCUMENTS

CN 101090117 A 12/2007
CN 105009286 A 10/2015
(Continued)

OTHER PUBLICATIONS

The Chinese 1st Office Action issued on Mar. 30, 2022 for CN202110373398.3.

(Continued)

*Primary Examiner* — Cory W Eskridge
(74) *Attorney, Agent, or Firm* — Yue (Robert) Xu; Apex Attorneys at Law, LLP

(57) ABSTRACT

A dynamic random access memory and a forming method therefor. The dynamic random access memory comprises: a substrate (100), which has opposite first surface (101) and second surface (102), and comprises several active regions (103), and each active region (103) comprises an isolation region (104), a channel region (105) and a word line region (106); a first isolation layer (108), which is located in the isolation region (104); a word line gate structure (111), which is located in the word line region (106); a first source/drain dope region (112), which is located in the channel region (105) on the first surface (101); a bit line layer (114) which is located on the first surface (101); a second source/drain dope region (116) which is located in
(Continued)

the channel region (105) on the second surface (102); and several capacitor structures (119), which are located on the second surface (102).

20 Claims, 8 Drawing Sheets

(51) Int. Cl.
*H10P 50/00* (2026.01)
*H10W 70/695* (2026.01)
(52) U.S. Cl.
CPC .......... *H10D 62/116* (2025.01); *H10P 50/00* (2026.01); *H10W 70/695* (2026.01)

(56) References Cited

U.S. PATENT DOCUMENTS

| | | | |
|---|---|---|---|
| 5,831,301 A | 11/1998 | Horak et al. | |
| 6,294,426 B1 | 9/2001 | Tu et al. | |
| 2003/0030090 A1 | 2/2003 | Sasaki | |
| 2013/0299834 A1 | 11/2013 | Lee et al. | |
| 2014/0264539 A1 | 9/2014 | Do et al. | |
| 2017/0031221 A1 | 2/2017 | Sugimoto et al. | |
| 2020/0286895 A1* | 9/2020 | Tang | H10B 12/482 |
| 2021/0005611 A1* | 1/2021 | Sukekawa | H10B 12/033 |
| 2021/0028176 A1* | 1/2021 | Derner | G11C 11/404 |
| 2021/0066135 A1* | 3/2021 | Pandey | H10B 12/05 |
| 2023/0171937 A1* | 6/2023 | Doornbos | H10B 12/03 257/296 |
| 2023/0240066 A1* | 7/2023 | Yeong | G11C 5/063 |

FOREIGN PATENT DOCUMENTS

| | | | |
|---|---|---|---|
| CN | 110265398 | A | 9/2019 |
| CN | 112185961 | A | 1/2021 |
| CN | 112864158 | A | 5/2021 |
| KR | 20090107817 | A | 10/2009 |
| KR | 20110033665 | A | 3/2011 |
| KR | 20130127134 | A | 11/2013 |

OTHER PUBLICATIONS

The Korean 1st Office Action issued on Dec. 16, 2024 for KR10-2023-7038078.

International Search Report for PCT/CN2021/116127 mailed Dec. 22, 2021, ISA/CN.

* cited by examiner

DYNAMIC RANDOM ACCESS MEMORY AND FORMING METHOD THEREFOR

This application claims the benefit of priority to Chinese Patent Application No. 202110373398.3, filed on Apr. 7, 2021 with China National Intellectual Property Administration, and entitled "DYNAMIC RANDOM ACCESS MEMORY AND FORMING METHOD THEREFOR", the entire disclosure of which is incorporated herein by reference.

TECHNICAL FIELD

The present disclosure relates to the field of semiconductor manufacturing technology, and particularly, to a dynamic random access memory and a method for forming the same.

BACKGROUND

Today, with rapid development of science and technology, semiconductor memories are widely applied in electronic devices. Among them, dynamic random access memory (DRAM), a type of volatile memory, is the most commonly used solution for applications that store large amounts of data.

Usually, dynamic random access memory is composed of a plurality of storage units. Each of the storage units is mainly composed of a transistor and a capacitor controlled by the transistor. And, the storage units are electrically coupled with each other through a word line and a bit line.

However, there are still many problems with the existing dynamic random access memories.

SUMMARY

The present disclosure provides a dynamic random access memory and a method for forming the same, which enable to effectively reduce process difficulty, improve storage capacity of a capacitor structure in the memory, and enhance memory density of the memory.

The present disclosure provides a dynamic random access memory, which includes a substrate, which has opposite first and second surfaces, and includes several discrete active areas parallel to a first direction and arranged in a second direction, wherein the first direction is perpendicular to the second direction, each of the active areas includes a plurality of isolation regions, a plurality of channel regions, and a plurality of word line regions, and in each of the active areas, the isolation regions and the channel regions are arranged at intervals in the first direction, and the word line regions are disposed between adjacent isolation regions and channel regions; a word line gate structure, which is disposed in the word line regions, extends from the first surface to the second surface, and runs through the active areas along the second direction; a plurality of first doped source/drain regions, which are disposed in the channel regions in the first surface; a plurality of bit line layers, which are parallel to the first direction and disposed on the first surface, and each of which is electrically coupled to the plurality of first doped source/drain regions in one of the active areas; a plurality of second doped source/drain regions, which are disposed in the channel regions in the second surface; a first isolation layer, which is disposed in the isolation regions, and runs through the substrate in a direction from the first surface to the second surface; a second isolation layer, which is disposed in the channel regions, and extends in a direction from the second surface to the first surface; and a plurality of capacitor structures, which are disposed on the second surface, and each of which is electrically coupled to one of the second doped source/drain regions.

Optionally, the dynamic random access memory further includes an isolation structure, which is disposed between adjacent active areas, and runs through the substrate in a direction from the first surface to the second surface.

Optionally, the word line regions have a word line gate trench, which extends from the first surface to the second surface, and runs through the active areas in the second direction; and the word line gate structure includes a word line gate dielectric layer disposed on side and bottom surfaces of the word line gate trench, as well as a word line gate layer disposed on the word line gate dielectric layer.

Optionally, the word line gate layer includes a single-layered structure or a multi-layered structure.

Optionally, when the word line gate layer is the single-layered structure, material of the word line gate layer includes a metal or polycrystalline silicon.

Optionally, the second isolation layer has a height greater than half the height of the word line gate layer, in the direction from the second surface to the first surface.

Optionally, when the word line gate layer is the multi-layered structure, the word line gate layer includes a first gate layer and a second gate layer disposed on the first gate layer, and materials of the first gate layer and the second gate layer are different.

Optionally, the material of the first gate layer includes a metal or polycrystalline silicon, and the material of the second gate layer includes polycrystalline silicon or a metal.

Optionally, when the material of the first gate layer is polycrystalline silicon, the second isolation layer has a height greater than the height of the first gate layer, in the direction from the second surface to the first surface; and when the material of the second gate layer is polycrystalline silicon, the second isolation layer has a height greater than the height of the second gate layer, in the direction from the second surface to the first surface.

Optionally, the dynamic random access memory further includes a first conductive plug disposed on each of the first doped source/drain regions, and wherein each of the bit line layers is electrically coupled to a plurality of the first conductive plugs on one of the active areas.

Optionally, the dynamic random access memory further includes a second conductive plug disposed on each of the second doped source/drain regions, and wherein each of the capacitor structures is electrically coupled to one second conductive plug.

Optionally, the capacitor structures include a first electrode layer, a second electrode layer, and a dielectric layer disposed between the first electrode layer and the second electrode layer.

Optionally, the capacitor structures have projection overlapping partially with the projection of the word line gate structure, in the direction from the second surface to the first surface.

Correspondingly, the present disclosure further provides a method for forming a dynamic random access memory. The method includes providing a substrate, which has opposite first and second surfaces, and includes several discrete active areas parallel to a first direction and arranged in a second direction, wherein the first direction is perpendicular to the second direction, each of the active areas includes a plurality of isolation regions, a plurality of channel regions, and a plurality of word line regions, and in each of the active areas, the isolation regions and the channel regions are arranged at intervals in the first direction, and the word line regions are disposed between adjacent isolation regions and channel regions; forming in the word line regions a plurality of word line gate trenches, which extend from the first surface to the second surface, and run through the active areas along the second direction; forming a word line gate structure in the word line gate trenches; forming a plurality of first doped source/drain regions in the first surface; forming on the first surface a plurality of bit line layers, which are parallel to the first direction, and each of which is electrically coupled to the plurality of first doped source/drain regions of the plurality of channel regions in one of the active areas; forming a plurality of second doped source/drain regions in the second surface; thinning the substrate in a direction from the second surface to the first surface, until a surface of the first isolation layer is exposed; etching the isolation regions in the direction from the second surface to the first surface, so as to form in the substrate a plurality of first isolation openings, which are parallel to the second direction; forming a first isolation layer in the first isolation openings; etching a part of the channel regions in the direction from the second surface to the first surface, so as to form a second isolation opening in the channel regions; forming a second isolation layer in the second isolation opening; and forming on the second surface a plurality of capacitor structures, each of which is electrically coupled to one of the second doped source/drain regions.

Optionally, the method further includes forming an isolation structure between adjacent active areas.

Optionally, method for forming the isolation structure includes forming a first isolation material layer between adjacent active areas and on the first surface; and thinning the first isolation material layer, until the first surface is exposed, so as to form the isolation structure.

Optionally, the word line gate structure includes a word line gate dielectric layer disposed on side and bottom surfaces of the word line gate trenches, as well as a word line gate layer disposed on the word line gate dielectric layer.

Optionally, the word line gate layer includes a single-layered structure or a multi-layered structure.

Optionally, when the word line gate layer is the single-layered structure, material of the word line gate layer includes a metal or polycrystalline silicon.

Optionally, the second isolation layer has a height greater than half the height of the word line gate layer, in the direction from the second surface to the first surface.

Optionally, when the word line gate layer is the multi-layered structure, the word line gate layer includes a first gate layer and a second gate layer disposed on the first gate layer, and materials of the first gate layer and the second gate layer are different.

Optionally, the material of the first gate layer includes a metal or polycrystalline silicon, and the material of the second gate layer includes polycrystalline silicon or a metal.

Optionally, when the material of the first gate layer is polycrystalline silicon, the second isolation layer has a height greater than the height of the first gate layer, in the direction from the second surface to the first surface; and when the material of the second gate layer is polycrystalline silicon, the second isolation layer has a height greater than the height of the second gate layer, in the direction from the second surface to the first surface.

Optionally, before forming the plurality of bit line layers, the method further includes forming a first conductive plug on the first doped source/drain regions of each of the channel regions, and wherein each of the bit line layers is electrically coupled to a plurality of the first conductive plugs on one of the active areas.

Optionally, before forming the plurality of capacitor structures, the method further includes forming a second conductive plug on each of the second doped source/drain regions, and wherein each of the capacitor structures is electrically coupled to one second conductive plug.

Optionally, the capacitor structures include a first electrode layer, a second electrode layer, and a dielectric layer disposed between the first electrode layer and the second electrode layer.

Optionally, the capacitor structures have projection overlapping partially with the projection of the word line gate structure, in the direction from the second surface to the first surface.

Embodiments of the present disclosure have the following advantages.

In structures according to the embodiments of the present disclosure, the bit line layers and the capacitor structures are disposed on the first surface and the second surface of the substrate, respectively, enabling to effectively reduce difficulty in circuit wiring and manufacturing process. Moreover, the capacitor structures are disposed on the second surface of the substrate, making the capacitor structures have a larger structural space and further an increased storage capacity. In addition, the disposition of the bit line layers and the capacitor structures on the first surface and the second surface of the substrate, respectively, further enables to effectively reduce an area occupied by a single storage structure, thereby improving memory density of the memory.

In the method according to the embodiments of the present disclosure, the bit line layers and the capacitor structures are disposed on the first surface and the second surface of the substrate, respectively, enabling to effectively reduce difficulty in circuit wiring and manufacturing process. Moreover, the capacitor structures are disposed on the second surface of the substrate, making the capacitor structures have a larger structural space and further an increased storage capacity. In addition, the disposition of the bit line layers and the capacitor structures on the first surface and the second surface of the substrate, respectively, further enables to effectively reduce an area occupied by a single storage structure, thereby improving memory density of the memory.

DETAILED DESCRIPTION

As stated in the BACKGROUND, there are still many problems with existing dynamic random access memories, which will be specifically explained below.

In existing dynamic random access memories, a bit line and an electrically conductive structure connected thereto are further provided between a capacitor, a word line, and a transistor. Thus, a capacitor structure formed to connect the capacitor with the word line and the transistor, the bit line, and the electrically conductive structure connected to the bit line should avoid each other, resulting in complex circuit wiring and sheer manufacturing difficulty in a storage array region of the memories.

Moreover, on one hand, since circuit wiring is complex in the storage array region, circuits other than the capacitor will occupy a relatively large area, resulting in decreases in memory density of the memory and thus in the storage capacity of the capacitor. On the other hand, the structure of the capacitor may also be affected by a logic circuit structure of the memory, such as a height of a plug for connecting different circuits in the logic circuit, etc. Therefore, height of the capacitor may be limited, resulting in a relatively small area and further a smaller storage capacity of the capacitor.

On this basis, the present disclosure provides a dynamic random access memory and a method for forming the same, which enable to effectively reduce difficulty in circuit wiring and manufacturing process by disposing the bit line layers and the capacitor structures on the first surface and the second surface of the substrate, respectively. Moreover, the disposition of the capacitor structures on the second surface of the substrate makes the capacitor structures have a larger structural space and further an increased storage capacity. In addition, the disposition of the bit line layers and the capacitor structures on the first surface and the second surface of the substrate, respectively, further enables to effectively reduce an area occupied by a single storage structure, thereby improving memory density of the memory.

In order to make the above objectives, features, and advantages of the present disclosure more obvious and understandable, specific embodiments of the present disclosure will be explained in detail below in conjunction with the accompanying drawings.

FIGS. 1 to 17 are schematic structure diagrams of a method for forming a dynamic random access memory according to embodiments of the present disclosure.

Figure 1:
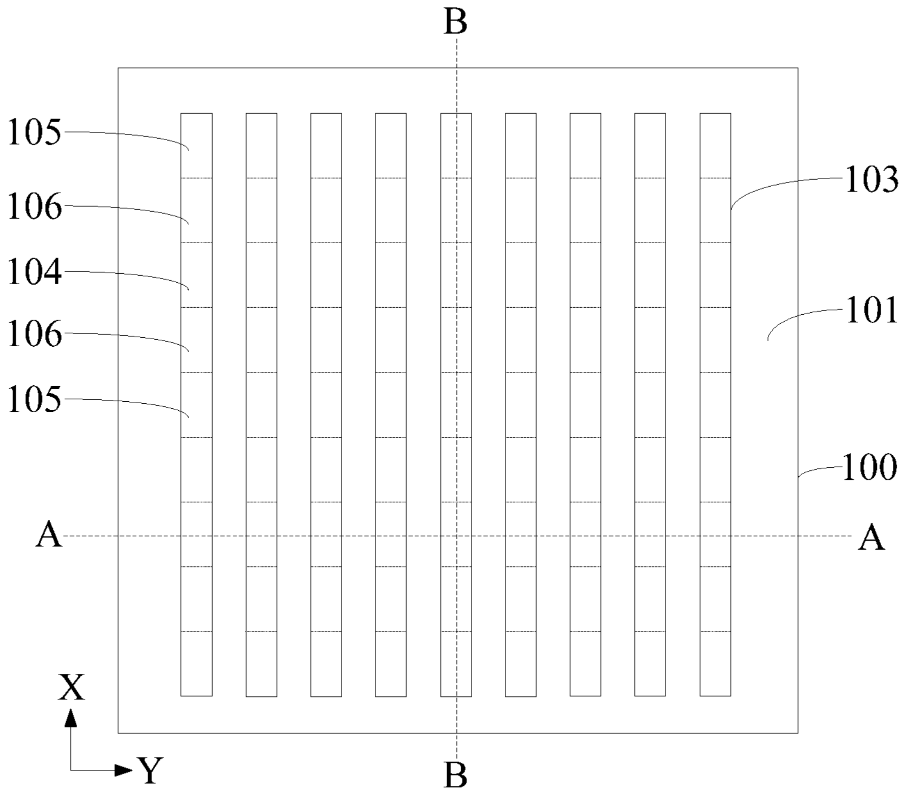
FIGS. 1 to 17 are schematic structure diagrams in processes of a method for forming a dynamic random access memory according to embodiments of the present disclosure.
Figure 2:
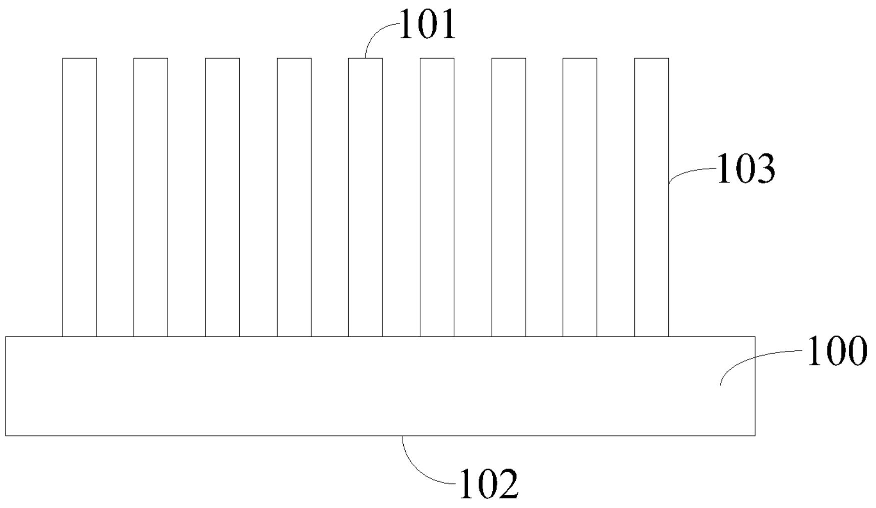
Figure 3:
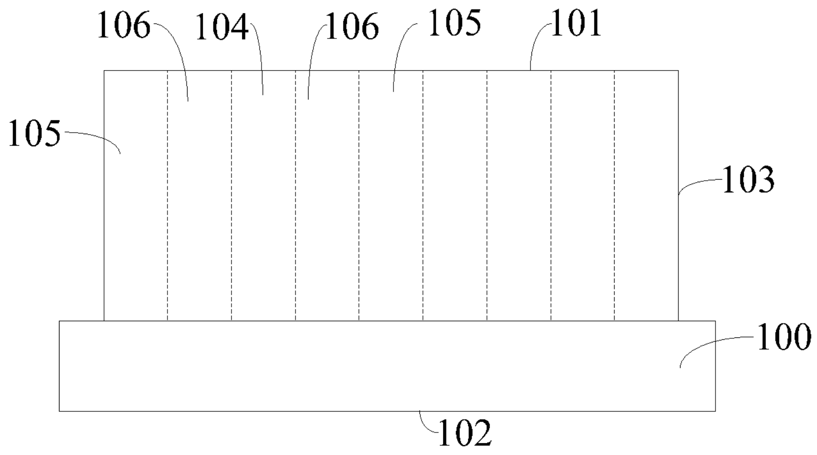

Please refer to FIGS. 1 to 3, wherein FIG. 2 is a schematic sectional view along the A-A line in FIG. 1, and FIG. 3 is a schematic sectional view along the B-B line in FIG. 1. A substrate 100 is provided, which has opposite first surface 101 and second surface 102, and includes several discrete active areas 103 parallel to a first direction X and arranged in a second direction Y The first direction X is perpendicular to the second direction Y And, each of the active areas 103 includes a plurality of isolation regions 104, a plurality of channel regions 105, and a plurality of word line regions 106. Additionally, in each of the active areas 103, the isolation regions 104 and the channel regions 105 are arranged at intervals in the first direction X, and the word line regions 106 are disposed between adjacent isolation regions 104 and channel regions 105.

In this embodiment, material of the substrate 100 is silicon. And, according to other embodiments, the material of the substrate may also be germanium, silicon germanide, silicon carbide, gallium arsenide, or indium gallide.

In this embodiment, the channel regions 105 and the word line regions 106 are used to subsequently form a transistor device. And, the isolation regions 104 are used to subsequently form a first isolation layer, which plays a role in rendering a word line gate structure to be formed subsequently connecting via only one side with the channel region(s) 105, thereby making the transistor formed in a uni-directional channel structure. A dynamic random access memory of a uni-directional channel structure is not prone to leak current during operation, and needs to subsequently form a first conductive plug on only the channel regions 105, effectively reducing the number of the first conductive plug and saving production costs.

Figure 4:
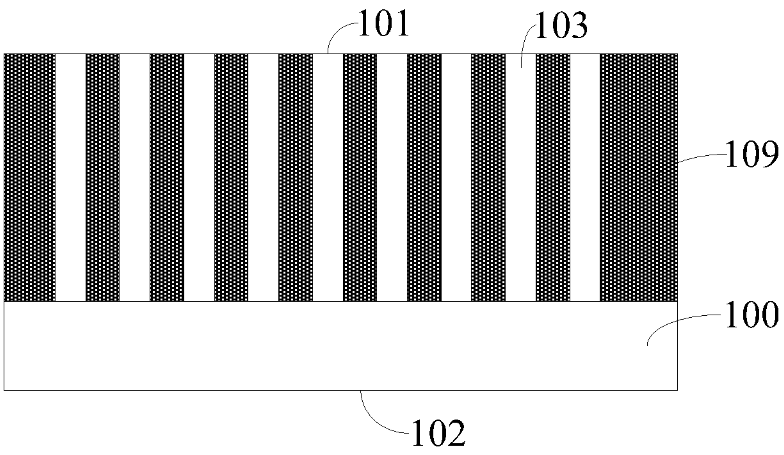

Please refer to FIG. 4, which has a view direction consistent with that in FIG. 2. In FIG. 4, an isolation structure 109 is formed between adjacent active areas 103.

In this embodiment, a method for forming the isolation structure 109 may include forming a first isolation material layer (not shown) between adjacent active areas 103 and on the first surface 101; and thinning the first isolation material layer, until the first surface 101 is exposed, so as to form the isolation structure 109.

Figure 5:
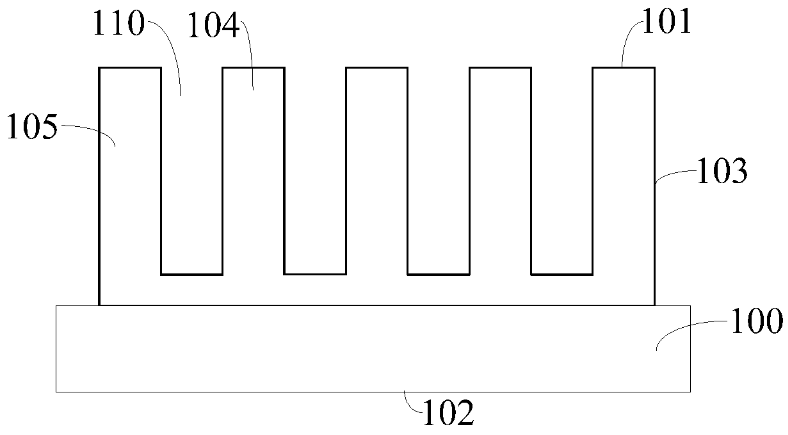

In this embodiment, material of the first isolation material layer is silicon oxide. Please refer to FIG. 5, which has a view direction consistent with that in FIG. 3. In FIG. 5, a plurality of word line gate trenches 110 are formed in the word line region(s) 106.

The word line gate trenches 110 extend from the first surface 101 to the second surface 102, and run through the active area(s) 103 along the second direction Y.

In this embodiment, the word line gate trenches 110 provide space to subsequently form a word line gate structure therein.

In this embodiment, a method for forming the word line gate trenches 110 includes forming on the first surface 101 of the substrate 100 a second patterned layer (not shown), which exposes the word line regions 106; and etching in a direction from the first surface 101 to the second surface 102 using an etching process with the second patterned layer as a mask, so as to form the word line gate trenches 110.

Figure 6:
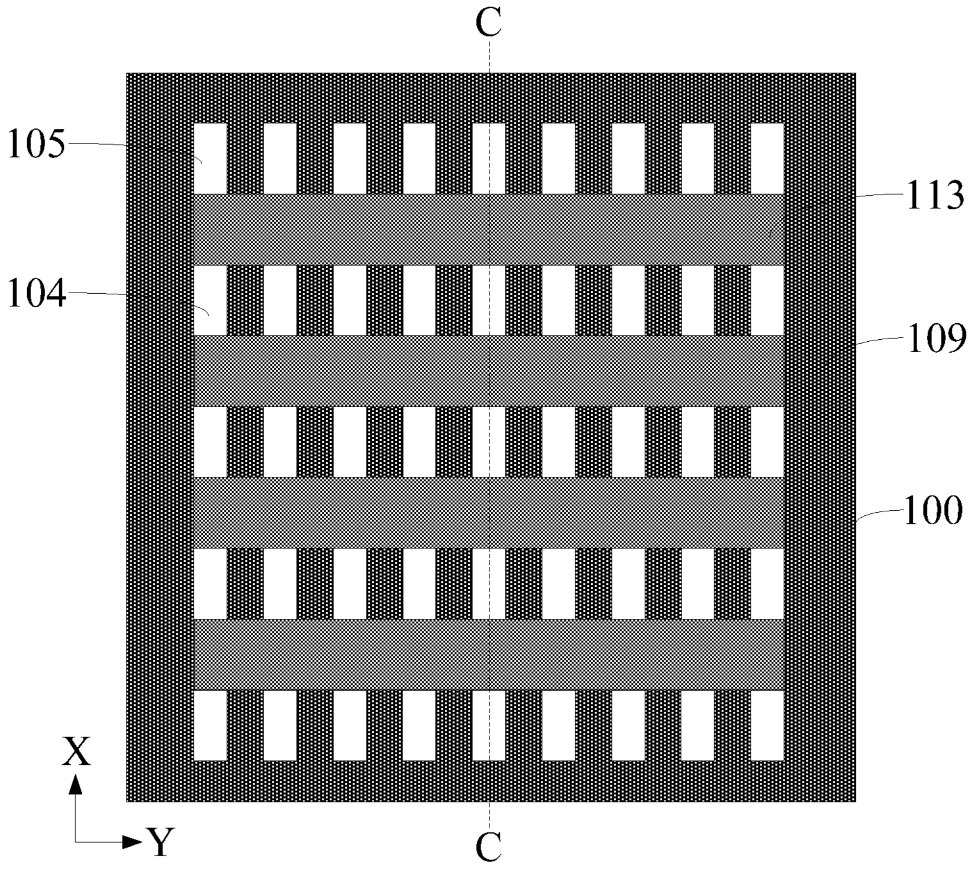
Figure 7:
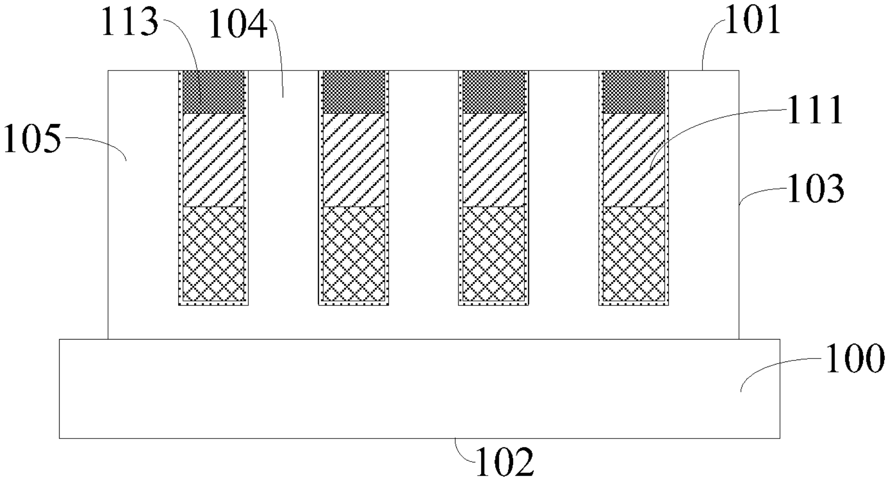

Please refer to FIGS. 6 and 7. FIG. 7 is a schematic sectional view along the C-C line in FIG. 6. A word line gate structure 111 is formed in the word line gate trenches 110.

In this embodiment, the word line gate structure 111 includes a word line gate dielectric layer (not indicated) disposed on side and bottom surfaces of the word line gate trenches 110, as well as a word line gate layer (not indicated) disposed on the word line gate dielectric layer.

In this embodiment, the word line gate layer is a multi-layered structure, and includes a first gate layer (not indicated) and a second gate layer (not indicated) disposed on the first gate layer. Materials of the first gate layer and the second gate layer are different.

In this embodiment, material of the first gate layer is polycrystalline silicon, and material of the second gate layer is a metal. According to other embodiments, the material of the first gate layer may also be a metal, and correspondingly, the material of the second gate layer may be polycrystalline silicon.

According to other embodiments, the word line gate layer may also be a single-layered structure. When the word line gate layer is a single-layered structure, the material thereof may be polycrystalline silicon or a metal.

In this embodiment, after forming the word line gate structure, further including forming a dielectric layer 113 on the first surface 101 of the substrate 100. The dielectric layer 113 fills the word line gate trenches 110, and exposes the first surface 101 in the channel regions 105.

Figure 8:
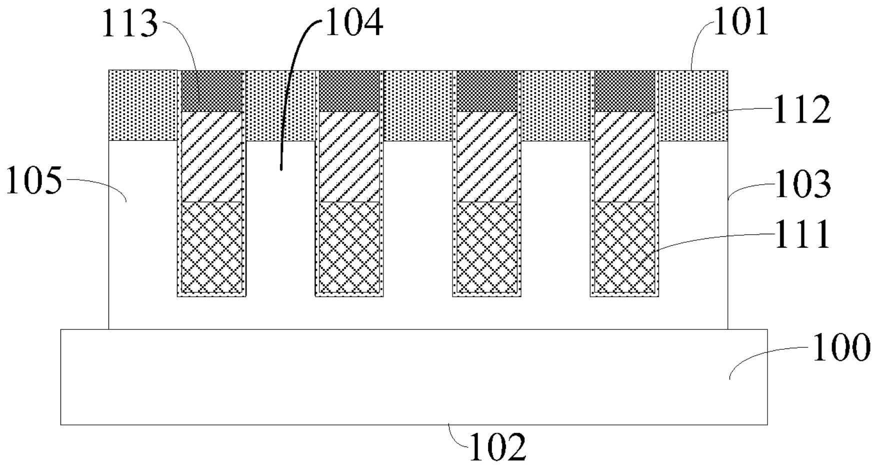

Please refer to FIG. 8, which has a view direction consistent with that in FIG. 7. A first doped source/drain region 112 is formed in the first surface 101.

In this embodiment, a method for forming the first doped source/drain region 112 in the first surface 101 includes implanting a first ion from the first surface 101 to the second surface 102 using an ion implantation process, so as to form the first doped source/drain region 112 in the first surface 101.

In this embodiment, the first ion may be an N-type ion. According to other embodiments, the first ion may also be a P-type ion.

Figure 9:
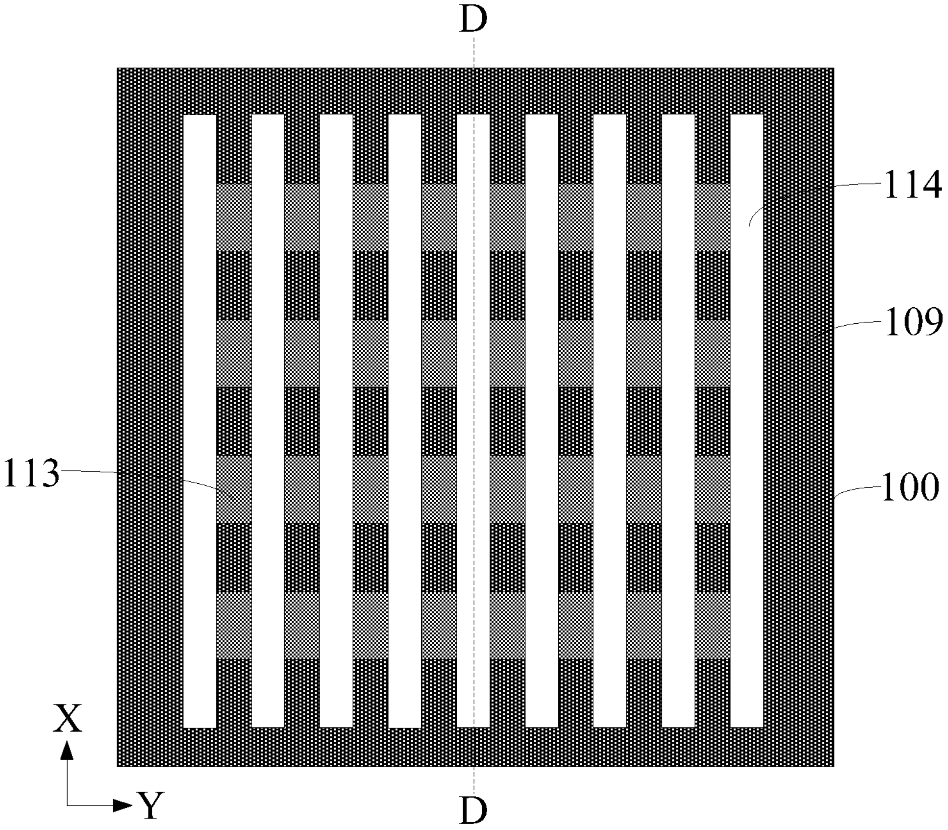
Figure 10:
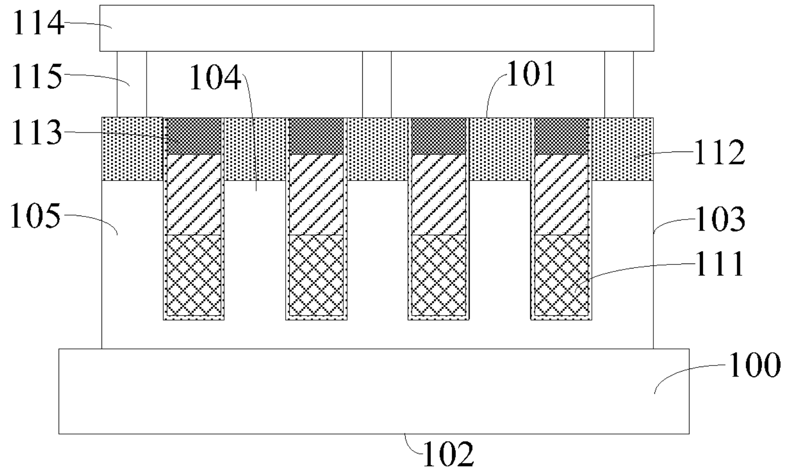

Please refer to FIGS. 9 and 10, wherein FIG. 10 is a schematic sectional view along the D-D line in FIG. 9. A plurality of bit line layers 114 are formed parallel to the first direction X on the first surface 101, and each electrically coupled to the first doped source/drain regions 112 of the plurality of channel regions 105 in one of the active areas 103.

In this embodiment, before forming the plurality of bit line layers 114, further including forming a first conductive plug 115 on the first doped source/drain region(s) 112 of each of the channel regions 105. And, each of the bit line layers 114 is electrically coupled to a plurality of first conductive plugs 115 on one of the active areas 103. According to other embodiments, the first conductive plug may not be formed.

Material of the bit line layers 114 includes a metal, including tungsten, aluminum, copper, etc. In this embodiment, the material of the bit line layers 114 is tungsten.

In this embodiment, a method for forming the bit line layers 114 includes forming a bit line material layer (not shown) on the first surface 101; forming a third patterned layer (not shown) on the bit line material layer, wherein the third patterned layer exposes a part of the bit line material layer; and etching the bit line material layer from the first surface 101 to the second surface 102 with the third patterned layer as a mask, so as to form the plurality of bit line layers 114.

A process for forming the bit line material layer includes metal electroplating processes, selective metal growth processes, or deposition processes. The deposition processes include chemical vapor deposition processes, physical vapor deposition processes, or atomic layer deposition processes. In this embodiment, an atomic layer deposition process is adopted as the process for forming the bit line material layer.

Figure 11:
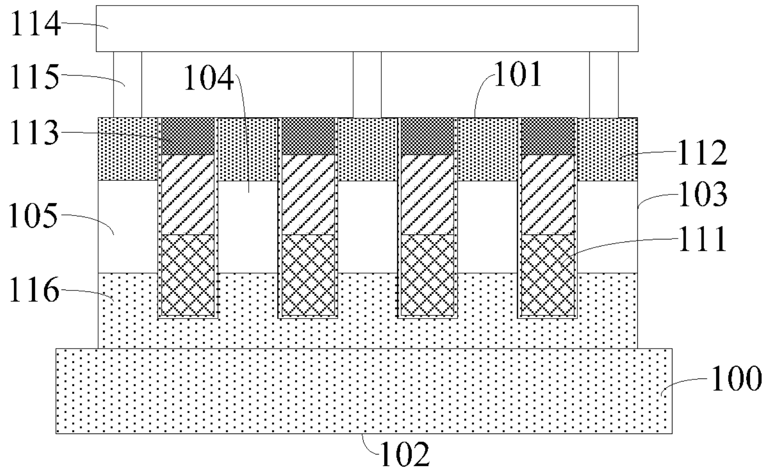

Please refer to FIG. 11, which has a view direction consistent with that in FIG. 10. A second doped source/drain region 116 is formed in the second surface 102.

In this embodiment, a method for forming a second doped source/drain region 116 in the second surface 102 includes implanting a second ion from the second surface 102 to the first surface 101 using an ion implantation process, so as to form the second doped source/drain region 116 in the second surface 102.

In this embodiment, the second ion has the same electrical type as the first ion, and may be an N-type ion. According to other embodiments, when the first ion is a P-type ion, the second ion may also be a P-type ion.

Thus, a plurality of transistors was formed in the substrate 100.

Figure 12:
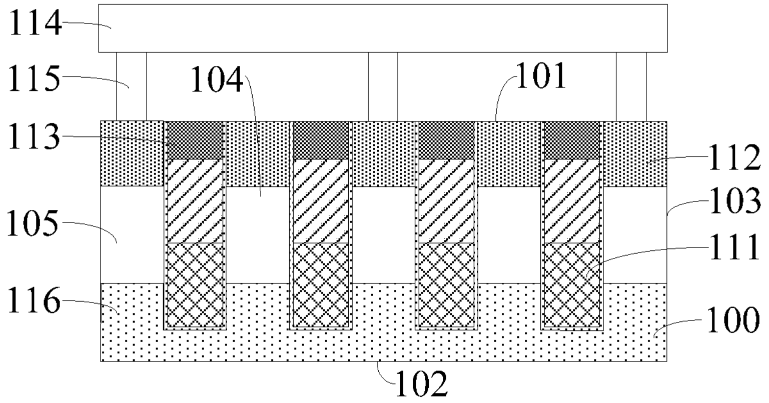

Please refer to FIG. 12, the substrate 100 is thinned in a direction from the second surface 102 to the first surface 101.

A process for thinning the substrate in the direction from the second surface 102 to the first surface 101 may include physical mechanical grinding processes, chemical mechanical grinding processes, or wet etching processes. In this embodiment, a chemical mechanical grinding process is adopted as the process for thinning the substrate in the direction from the second surface 102 to the first surface 101.

In this embodiment, the thinning treatment is carried out until a surface of the isolation structure 109 is exposed.

Figure 13:
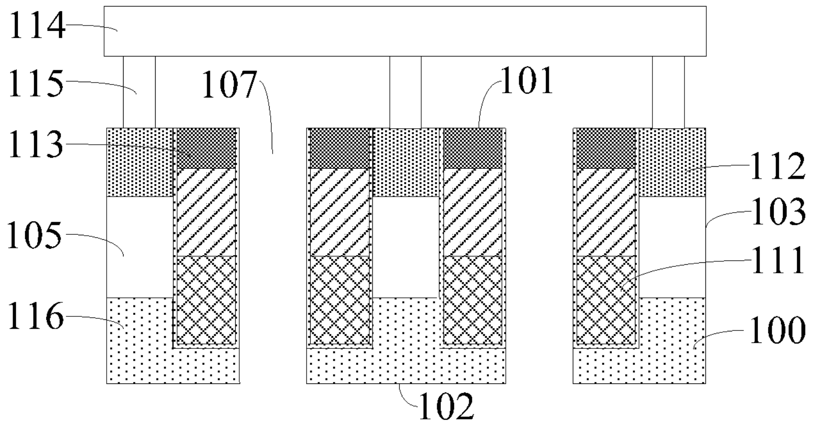

Please refer to FIG. 13, the isolation regions 104 are etched in the direction from the second surface 102 to the first surface 101, so as to form a plurality of first isolation openings 107 parallel to the second direction Y in the substrate 100.

In this embodiment, a method for forming the first isolation openings 107 includes forming on the second surface 102 of the substrate 100 a first patterned layer (not shown), which exposes the isolation regions 104; and etching in the direction from the second surface 102 to the first surface 101 using an etching process with the first patterned layer as a mask, so as to form the first isolation openings 107.

In this embodiment, the first isolation openings 107 are formed after the active areas 103 are formed. According to other embodiments, the first isolation openings may also be formed simultaneously with the active areas.

In this embodiment, the first isolation openings 107 run through the first surface 101 from the second surface 102. According to other embodiments, the first isolation openings may also run not through the first surface from the second surface, as long as it is ensured that a first isolation layer to be subsequently formed in the first isolation openings may separate adjacent channel regions.

Figure 14:
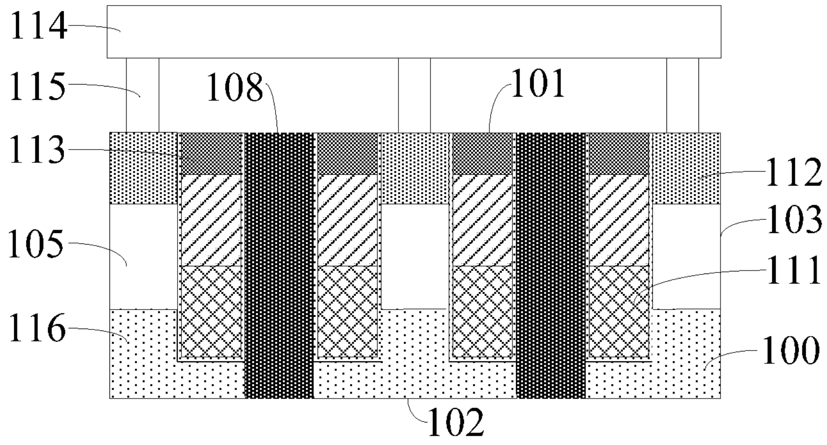

Please refer to FIG. 14, a first isolation layer 108 is formed in the first isolation openings 107.

In this embodiment, a method for forming the first isolation layer 108 may include forming a second isolation material layer (not shown) in the first isolation openings 107 and on the second surface 102; and thinning the second isolation material layer, until the second surface 102 is exposed, so as to form the first isolation layer 108.

In this embodiment, material of the second isolation material layer is silicon oxide.

Figure 15:
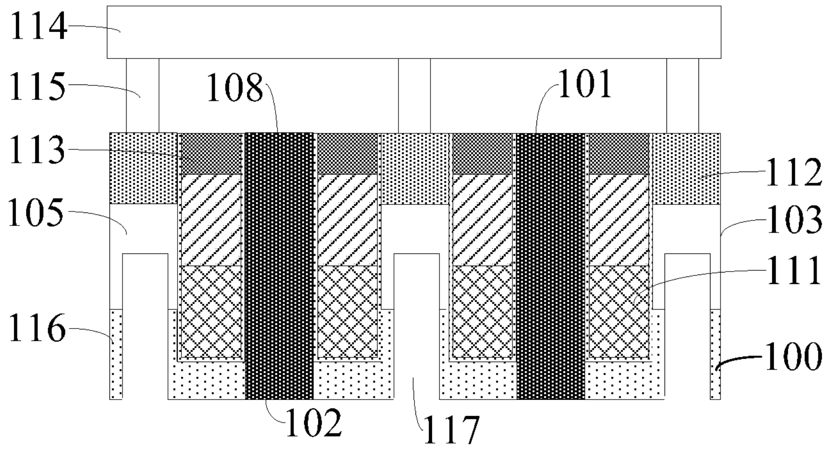

Please refer to FIG. 15, a part of the channel regions 105 are etched in the direction from the second surface 102 to the first surface 101, so as to form a second isolation opening 117 in the channel regions 105.

In this embodiment, the second isolation opening 117 is used to provide space for a second isolation layer to be formed subsequently. A method for forming the second isolation opening 117 may include forming on the second surface 102 a fourth patterned layer (not shown), which exposes surfaces of the part of the channel regions 105; and etching from the second surface 102 towards the first surface 101 with the fourth patterned layer as a mask, so as to form the second isolation opening 117 in the channel regions 105.

Figure 16:
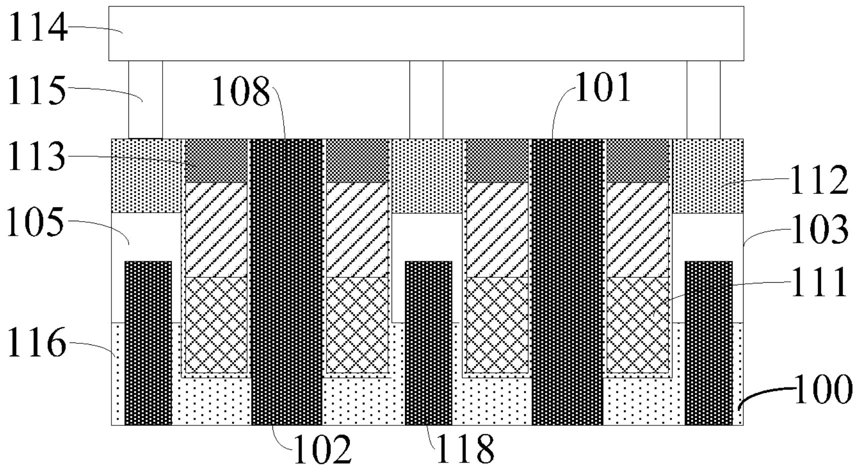

Please refer to FIG. 16, a second isolation layer 118 is formed in the second isolation opening 117.

In this embodiment, the second isolation layer 118 functions to isolate adjacent transistors and avoid serial connection between adjacent transistors.

In this embodiment, material of the second isolation layer 118 is silicon oxide.

In this embodiment, the second isolation layer 118 is formed after the first isolation layer 108 is formed. According to other embodiments, the first isolation layer and the second isolation layer may also be formed simultaneously. That is, the first isolation openings and the second isolation opening are first formed, and then filled with an isolation material simultaneously. Finally, a thinning treatment is carried out to form the first isolation layer and the second isolation layer simultaneously.

In this embodiment, since the material of the first gate layer is polycrystalline silicon and the material of the second gate layer is a metal, in order to ensure that the second isolation layer 118 completely isolates adjacent transistors, height of the second isolation layer 118 in the direction from the second surface 102 to the first surface 101 is greater than height of the first gate layer in the direction from the second surface 102 to the first surface 101.

According to other embodiments, when the material of the second gate layer is polycrystalline silicon, the height of the second isolation layer in the direction from the second surface to the first surface is greater than the height of the second gate layer in the direction from the second surface to the first surface.

According to other embodiments, when the word line gate layer is the single-layered structure, the height of the second isolation layer in the direction from the second surface to the first surface is greater than half the height of the word line gate layer in the direction from the second surface to the first surface.

Figure 17:
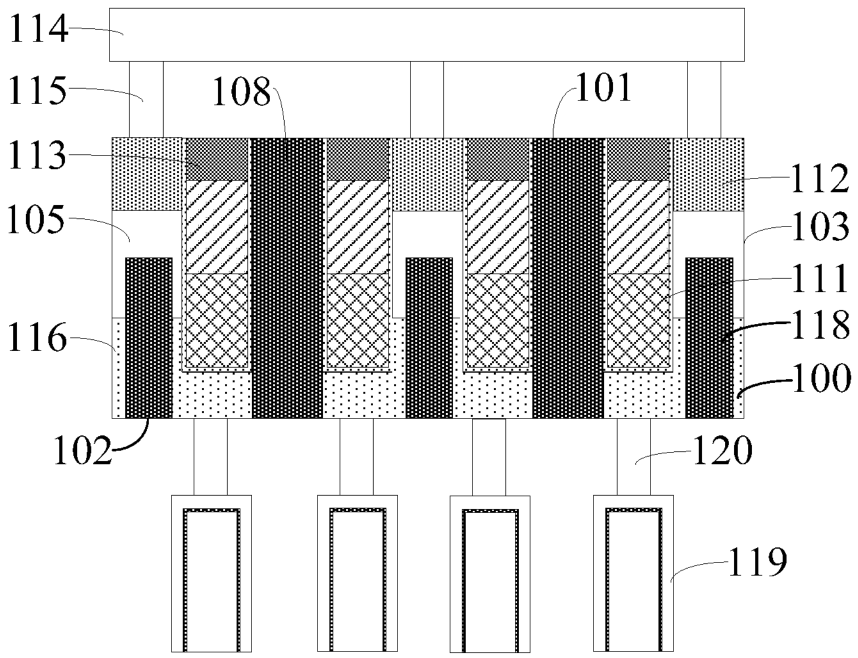

Please refer to FIG. 17, a plurality of capacitor structures 119 are formed on the second surface 102. And, each of the capacitor structures 119 is electrically coupled to one of the second doped source/drain regions 116.

In this embodiment, the bit line layers 114 and the capacitor structures 119 are disposed on the first surface 101 and the second surface 102 of the substrate 100, respectively, enabling to effectively reduce difficulty in circuit wiring and manufacturing process. Moreover, the capacitor structures 119 are disposed on the second surface 102 of the substrate 100, making the capacitor structures 119 have a larger structural space and further an increased storage capacity. In addition, the disposition of the bit line layers 114 and the capacitor structures 119 on the first surface 101 and the second surface 102 of the substrate 100, respectively, further enables to effectively reduce an area occupied by a single storage structure, thereby improving memory density of the memory.

In this embodiment, a two-dimensional matrix is disposed with one of the capacitor structures 119 and one of the transistors as one unit. The basic operation mechanism is divided into Read and Write. When reading, the bit line layers 114 are first charged to half of the operating voltage, and the transistors are then turned on, in order to cause charge sharing between the bit line layers 114 and the capacitor structures 119. If a value stored internally is 1, the voltage of the bit line layers 114 will be raised by charge sharing to higher than half of the operating voltage. On the contrary, if the value stored internally is 0, the voltage of the bit line layers 114 will be pulled down to lower than half of the operating voltage. After the voltage of the bit line layers 114 is obtained, it may be determined by an amplifier whether the internal value is 0 or 1. When writing, the transistors will be turned on. If 1 is to be written, the voltage of the bit line layers 114 may be raised to the operating voltage to store the operating voltage on the capacitor structures 119. If 0 is to be written, the voltage of the bit line layers 114 may be lowered to 0 volts, so that there is no charge inside the capacitor structures 119.

In this embodiment, before formation of the plurality of capacitor structures 119, further including forming a second conductive plug 120 on each of the second doped source/drain regions 116, and wherein each of the capacitor structures 119 is electrically coupled to one second conductive plug 120. According to other embodiments, the second conductive plug may not be formed.

In this embodiment, the capacitor structures 119 include a first electrode layer, a second electrode layer, and a dielectric layer disposed between the first electrode layer and the second electrode layer (not indicated).

In this embodiment, the projection of the capacitor structures 119 in the direction from the second surface 102 to the first surface 101 overlaps partially with the projection of the word line gate structures 111 in the direction from the second surface 102 to the first surface 101.

Correspondingly, the embodiments of the present disclosure further provide a dynamic random access memory. Please refer to FIG. 17, the dynamic random access memory includes a substrate 100, which has opposite first surface 101 and second surface 102, and includes several discrete active areas 103 parallel to a first direction X and arranged in a second direction Y, wherein the first direction X is perpendicular to the second direction Y, each of the active areas 103 includes a plurality of isolation regions 104, a plurality of channel regions 105, and a plurality of word line regions 106, and in each of the active areas 103, the isolation regions 104 and the channel regions 105 are arranged at intervals in the first direction X, and the word line regions 106 are disposed between adjacent isolation regions 104 and channel regions 105; a word line gate structure 111, which is disposed in the word line regions 106, extends from the first surface 101 to the second surface 102, and runs through the active areas 103 along the second direction Y; a plurality of first doped source/drain regions 112, which are disposed in the channel regions 105 in the first surface 101; a plurality of bit line layers 114, which are parallel to the first direction X and disposed on the first surface 101, and each of which is electrically coupled to the plurality of first doped source/drain regions 112 in one of the active areas 103; a plurality of second doped source/drain regions 116, which are disposed in the channel regions 105 in the second surface 103; a first isolation layer 108, which is disposed in the isolation regions 104, and runs through the substrate 100 in a direction from the first surface 101 to the second surface 102; a second isolation layer 118, which is disposed in the channel regions 105, and extends in a direction from the second surface 102 to the first surface 101; and a plurality of capacitor structures 119, which are disposed on the second surface 102, and each of which is electrically coupled to one of the second doped source/drain regions 116.

In this embodiment, the bit line layers 114 and the capacitor structures 119 are disposed on the first surface 101 and the second surface 102 of the substrate 100, respectively, enabling to effectively reduce difficulty in circuit wiring and manufacturing process. Moreover, the capacitor structures 119 are disposed on the second surface 102 of the substrate 100, making the capacitor structures 119 have a larger structural space and further an increased storage capacity. In addition, the disposition of the bit line layers 114 and the capacitor structures 119 on the first surface 101 and the second surface 102 of the substrate 100, respectively, further enables to effectively reduce an area occupied by a single storage structure, thereby improving memory density of the memory.

In this embodiment, the memory further includes an isolation structure 109, which is disposed between adjacent active areas 103, and runs through the substrate 100 in the direction from the first surface 101 to the second surface 102.

In this embodiment, the word line regions 106 have a word line gate trench 110, which extends from the first surface 101 to the second surface 102, and runs through the active areas 103 along the second direction Y And, the word line gate structure 111 includes a word line gate dielectric layer disposed on side and bottom surfaces of the word line gate trench 110, as well as a word line gate layer disposed on the word line gate dielectric layer.

In this embodiment, the word line gate layer adopts a multi-layered structure. When the word line gate layer is the multi-layered structure, the word line gate layer includes a first gate layer and a second gate layer disposed on the first gate layer. Materials of the first gate layer and the second gate layer are different.

In this embodiment, the material of the first gate layer is polycrystalline silicon, and the material of the second gate layer is a metal. According to other embodiments, the material of the first gate layer may also be a metal, and the material of the second gate layer is polycrystalline silicon.

In this embodiment, when the material of the first gate layer is polycrystalline silicon, height of the second isolation layer 118 in a direction from the second surface 102 to the first surface 101 is greater than height of the first gate layer in the direction from the second surface 102 to the first surface 101.

According to other embodiments, when the material of the second gate layer is polycrystalline silicon, the height of the second isolation layer in the direction from the second surface to the first surface is greater than the height of the second gate layer in the direction from the second surface to the first surface.

According to other embodiments, the word line gate layer may also adopt a single-layered structure. When the word line gate layer is the single-layered structure, the material of the word line gate layer includes a metal or polycrystalline silicon.

According to other embodiments, when the word line gate layer adopts the single-layered structure, the height of the second isolation layer in the direction from the second surface to the first surface is greater than half the height of the word line gate layer in the direction from the second surface to the first surface.

In this embodiment, the memory further includes a first conductive plug 115 disposed on each of the first doped source/drain regions 112. And, each of the bit line layers 114 is electrically coupled to a plurality of first conductive plugs 115 on one of the active areas 103.

In this embodiment, the memory further includes a second conductive plug 120 disposed on each of the second doped source/drain regions 116. And, each of the capacitor structures 119 is electrically coupled to one second conductive plug 120.

In this embodiment, the capacitor structures 119 include a first electrode layer, a second electrode layer, and a dielectric layer disposed between the first electrode layer and the second electrode layer.

In this embodiment, the projection of the capacitor structures 119 in the direction from the second surface 102 to the first surface 101 overlaps partially with the projection of the word line gate structure 111 in the direction from the second surface 102 to the first surface 101.

Although the present disclosure is disclosed as above, the present disclosure is not limited hereto. Any person skilled in the art may make various changes and modifications without departing from the spirit and scope of the present disclosure. Therefore, the scope of protection of the present disclosure shall be subject to the scope limited by the claims.

What is claimed is:

1. A dynamic random access memory, comprising:

a substrate, which has opposite first and second surfaces, and comprises several discrete active areas parallel to a first direction and arranged in a second direction, wherein the first direction is perpendicular to the second direction, each of the active areas comprises a plurality of isolation regions, a plurality of channel regions, and a plurality of word line regions, and in each of the active areas, the isolation regions and the channel regions are arranged at intervals in the first direction, and the word line regions are disposed between adjacent isolation regions and channel regions;

a word line gate structure, which is disposed in the word line regions, extends from the first surface to the second surface, and runs through the active areas along the second direction;

a plurality of first doped source/drain regions, which are disposed in the channel regions in the first surface;

a plurality of bit line layers, which are parallel to the first direction and disposed on the first surface, and each of which is electrically coupled to the plurality of first doped source/drain regions in one of the active areas;

a plurality of second doped source/drain regions, which are disposed in the channel regions in the second surface;

a first isolation layer, which is disposed in the isolation regions, and runs through the substrate in a direction from the first surface to the second surface;

a second isolation layer, which is disposed in the channel regions, and extends in a direction from the second surface to the first surface; and a plurality of capacitor structures, which are disposed on the second surface, and each of which is electrically coupled to one of the second doped source/drain regions.

2. The dynamic random access memory according to claim 1, further comprising an isolation structure, which is disposed between adjacent active areas, and runs through the substrate in a direction from the first surface to the second surface.

3. The dynamic random access memory according to claim 1, wherein the word line regions have a word line gate trench, which extends from the first surface to the second surface, and runs through the active areas in the second direction; and the word line gate structure comprises a word line gate dielectric layer disposed on side and bottom surfaces of the word line gate trench, as well as a word line gate layer disposed on the word line gate dielectric layer.

4. The dynamic random access memory according to claim 3, wherein the word line gate layer comprises a single-layered structure or a multi-layered structure.

5. The dynamic random access memory according to claim 4, wherein when the word line gate layer is the single-layered structure, material of the word line gate layer comprises a metal or polycrystalline silicon; and wherein the second isolation layer has a height greater than half the height of the word line gate layer, in the direction from the second surface to the first surface.

6. The dynamic random access memory according to claim 4, wherein when the word line gate layer is the multi-layered structure, the word line gate layer comprises a first gate layer and a second gate layer disposed on the first gate layer, and materials of the first gate layer and the second gate layer are different; and wherein the material of the first gate layer comprises a metal or polycrystalline silicon, and the material of the second gate layer comprises polycrystalline silicon or a metal.

7. The dynamic random access memory according to claim 6, wherein when the material of the first gate layer is polycrystalline silicon, the second isolation layer has a height greater than the height of the first gate layer, in the direction from the second surface to the first surface; and when the material of the second gate layer is polycrystalline silicon, the second isolation layer has a height greater than the height of the second gate layer, in the direction from the second surface to the first surface.

8. The dynamic random access memory according to claim 1, further comprising a first conductive plug disposed on each of the first doped source/drain regions, and wherein each of the bit line layers is electrically coupled to a plurality of the first conductive plugs on one of the active areas.

9. The dynamic random access memory according to claim 1, further comprising a second conductive plug disposed on each of the second doped source/drain regions, and wherein each of the capacitor structures is electrically coupled to one second conductive plug.

10. The dynamic random access memory according to claim 1, wherein the capacitor structures have projection overlapping partially with the projection of the word line gate structure, in the direction from the second surface to the first surface.

11. A method for forming a dynamic random access memory, comprising:

- providing a substrate, which has opposite first and second surfaces, and comprises several discrete active areas parallel to a first direction and arranged in a second direction, wherein the first direction is perpendicular to the second direction, each of the active areas comprises a plurality of isolation regions, a plurality of channel regions, and a plurality of word line regions, and in each of the active areas, the isolation regions and the channel regions are arranged at intervals in the first direction, and the word line regions are disposed between adjacent isolation regions and channel regions;
- forming in the word line regions a plurality of word line gate trenches, which extend from the first surface to the second surface, and run through the active areas along the second direction;
- forming a word line gate structure in the word line gate trenches;
- forming a plurality of first doped source/drain regions in the first surface;
- forming on the first surface a plurality of bit line layers, which are parallel to the first direction, and each of which is electrically coupled to the first doped source/drain regions of the plurality of channel regions in one of the active areas;
- forming a plurality of second doped source/drain regions in the second surface;
- thinning the substrate in a direction from the second surface to the first surface;
- etching the isolation regions in the direction from the second surface to the first surface, so as to form in the substrate a plurality of first isolation openings, which are parallel to the second direction;
- forming a first isolation layer in the first isolation openings;
- etching a part of the channel regions in the direction from the second surface to the first surface, so as to form a second isolation opening in the channel regions;
- forming a second isolation layer in the second isolation opening; and
- forming on the second surface a plurality of capacitor structures, each of which is electrically coupled to one of the second doped source/drain regions.

12. The method for forming a dynamic random access memory according to claim 11, further comprising forming an isolation structure between adjacent active areas, wherein a method for forming the isolation structure comprises forming a first isolation material layer between adjacent active areas and on the first surface; and thinning the first isolation material layer, until the first surface is exposed, so as to form the isolation structure.

13. The method for forming a dynamic random access memory according to claim 11, wherein the word line gate structure comprises a word line gate dielectric layer disposed on side and bottom surfaces of the word line gate trenches, as well as a word line gate layer disposed on the word line gate dielectric layer.

14. The method for forming a dynamic random access memory according to claim 13, wherein the word line gate layer comprises a single-layered structure or a multi-layered structure.

15. The method for forming a dynamic random access memory according to claim 14, wherein when the word line gate layer is the single-layered structure, material of the word line gate layer comprises a metal or polycrystalline silicon; and wherein the second isolation layer has a height greater than half the height of the word line gate layer, in the direction from the second surface to the first surface.

16. The method for forming a dynamic random access memory according to claim 14, wherein when the word line gate layer is the multi-layered structure, the word line gate layer comprises a first gate layer and a second gate layer disposed on the first gate layer, and materials of the first gate layer and the second gate layer are different; and wherein the material of the first gate layer comprises a metal or polycrystalline silicon, and the material of the second gate layer comprises polycrystalline silicon or a metal.

17. The method for forming a dynamic random access memory according to claim 16, wherein when the material of the first gate layer is polycrystalline silicon, the second isolation layer has a height greater than the height of the first gate layer, in the direction from the second surface to the first surface; and when the material of the second gate layer is polycrystalline silicon, the second isolation layer has a height greater than the height of the second gate layer, in the direction from the second surface to the first surface.

18. The method for forming a dynamic random access memory according to claim 11, before forming the plurality of bit line layers, further comprising forming a first conductive plug on the first doped source/drain regions of each of the channel regions, and wherein each of the bit line layers is electrically coupled to a plurality of the first conductive plugs on one of the active areas.

19. The method for forming a dynamic random access memory according to claim 11, before forming the plurality of capacitor structures, further comprising forming a second conductive plug on each of the second doped source/drain regions, and wherein each of the capacitor structures is electrically coupled to one second conductive plug.

20. The method for forming a dynamic random access memory according to claim 11, wherein the capacitor structures have projection overlapping partially with the projection of the word line gate structure, in the direction from the second surface to the first surface.

* * * * *